(12) United States Patent
Jerez et al.

(10) Patent No.: US 8,653,475 B1
(45) Date of Patent: Feb. 18, 2014

(54) ION SOURCE

(71) Applicants: Manuel A. Jerez, Roosevelt, NY (US); Carlos F. Borges, Roslyn Estates, NY (US)

(72) Inventors: Manuel A. Jerez, Roosevelt, NY (US); Carlos F. Borges, Roslyn Estates, NY (US)

(73) Assignee: ion Technology Solutions, LLC, Mineola, NY (US)

( * ) Notice: Subject to any disclaimer, the term of this patent is extended or adjusted under 35 U.S.C. 154(b) by 0 days.

(21) Appl. No.: 13/649,564

(22) Filed: Oct. 11, 2012

(51) Int. Cl.
*H01J 27/00* (2006.01)
(52) U.S. Cl.
CPC ...................................... *H01J 27/00* (2013.01)
USPC ....................................... 250/426; 250/423 R
(58) Field of Classification Search
USPC .............................................. 250/426, 423 R
See application file for complete search history.

(56) References Cited

U.S. PATENT DOCUMENTS 6,583,427 B1 * 6/2003 Edmonds et al. ......... 250/492.21
6,818,909 B2 * 11/2004 Murrell et al. ............. 250/492.2

* cited by examiner

Primary Examiner — Kiet T Nguyen
(74) Attorney, Agent, or Firm — Francis C. Hand; Carella, Byrne, et al.

(57) ABSTRACT

An arc chamber assembly for an ion source comprising a housing having a base and at least one pair of side walls extending upwardly from opposite sides of the base to define an arc chamber, the base having a plurality of channels extending to each sidewall; an inlet port connected to the base for delivering a flow of gas into the channels; a bottom liner having at least one pair of notches in each of two opposite side edges thereof and disposed in the housing in spaced parallel relation to the base and opposite the channels for conducting a flow of gas from the inlet port towards the sidewalls, each notch being in communication with a respective channel of the plurality of channels to pass gas upwardly into the arc chamber; and a pair of side liners, each side liner being disposed in the housing in spaced parallel relation to a respective one of the side walls for conducting a flow of gas between the base and the bottom liner, each side liner having at least one pair of slots to horizontally pass gas into the arc chamber.

8 Claims, 4 Drawing Sheets

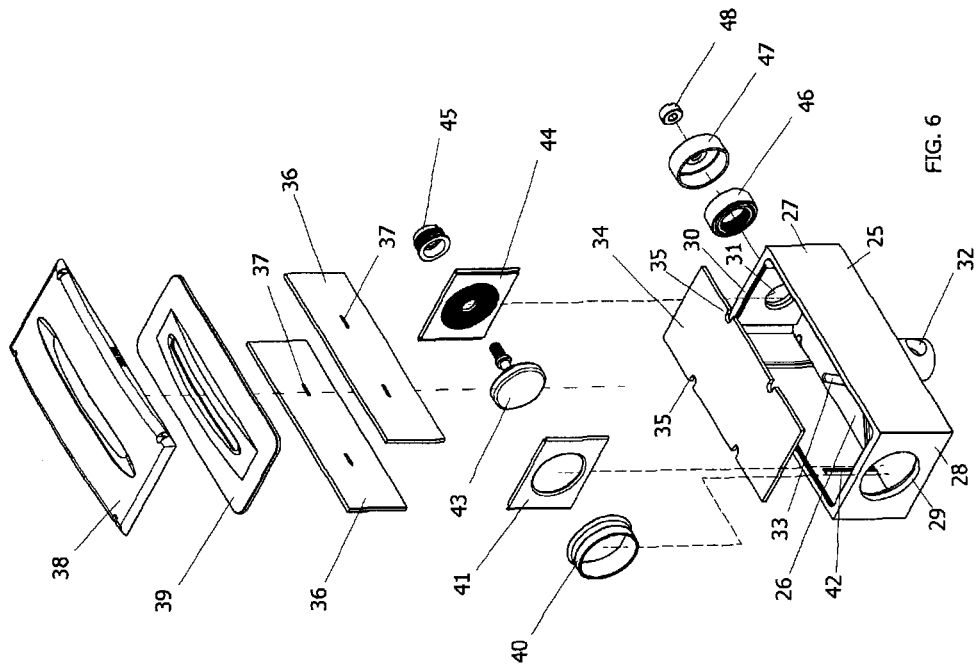
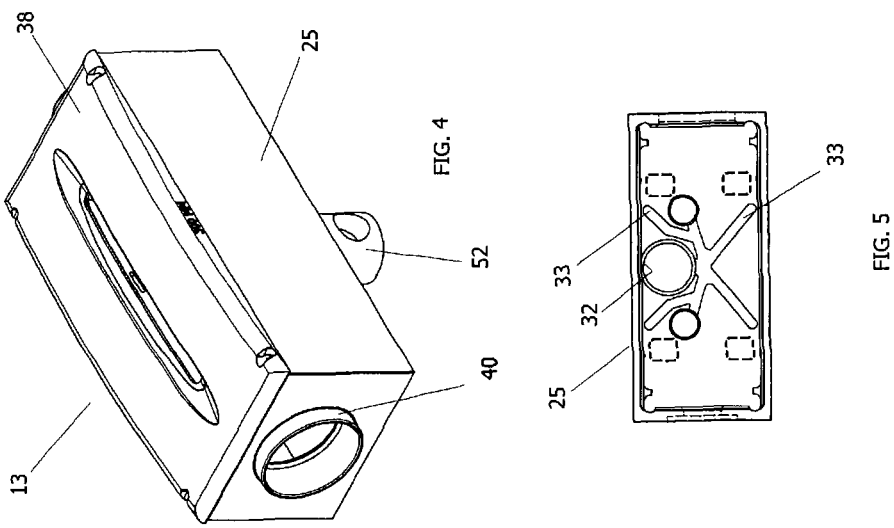

ION SOURCE

This invention relates to an improved ion source. More particularly, this invention relates to an improved arc chamber for an ion source. Still more particularly, this invention relates to ion sources typically used in ion implanters.

As is known, in the manufacture of semi-conductors, ion implanters are widely used to diffuse or implant positive ions onto regions of a semi-conductor wafer. These ion implanters use an ion source that generates an ion beam used to implant the semi-conductor wafers. The ion implanters may be of the indirectly heated cathode ion source type or a directly heated cathode type. As is known, in the manufacture of semi-conductors, ion implanters are widely used to diffuse or implant positive ions onto regions of a semi-conductor wafer. These ion implanters use an ion source that generates an ion beam used to implant the semi-conductor wafers. The ion implanters may be of the indirectly heated cathode ion source type or a directly heated cathode type.

As is also known, an indirectly heated cathode ion source includes an arc chamber, cathode assembly, filament, insulator block, graphite support plate, and a filament clamp assembly. The filament is positioned within a cavity defined by the cathode assembly and a cathode within the cathode assembly is heated by an electron bombardment from the filament. The cathode, in turn, emits electrons thermionically for generating a plasma along with a specific gas species within the arc chamber. An example of such an indirectly heated cathode ion source is described in co-pending U.S. patent application Ser. No. 12/655,347, filed Dec. 29, 2009.

A directly heated cathode generally includes an arc chamber, filament clamp assembly, and a filament positioned inside the arc chamber. The filament emits electrons thermionically for generating a plasma along with a specific gas species within the arc chamber.

It is an object of the invention to increase the efficiency of an ion source by reducing the heat loss from the ion source and its components.

It is another object of the invention to extend the continuous running time of an ion implanter by improving the efficiency of the ion source.

It is another object of the invention to reduce thermal loss from the filament clamps of an ion source.

It is another object of this invention to protect the filament clamps of an ion source.

It is another object of the invention to provide a uniform gas ionization region within an arc chamber of an ion source.

These and other objects and advantages of the invention will become more apparent from the following detailed description taken in conjunction with the accompanying drawings wherein:

FIG. 4 is an isometric view of the arc chamber assembly of FIG. 1 in accordance with the invention;.

FIG. 5 is a top view of the arc chamber assembly of FIG. 4;

FIG. 6 is an exploded view of the arc chamber assembly of FIG. 4;

Figure 2:
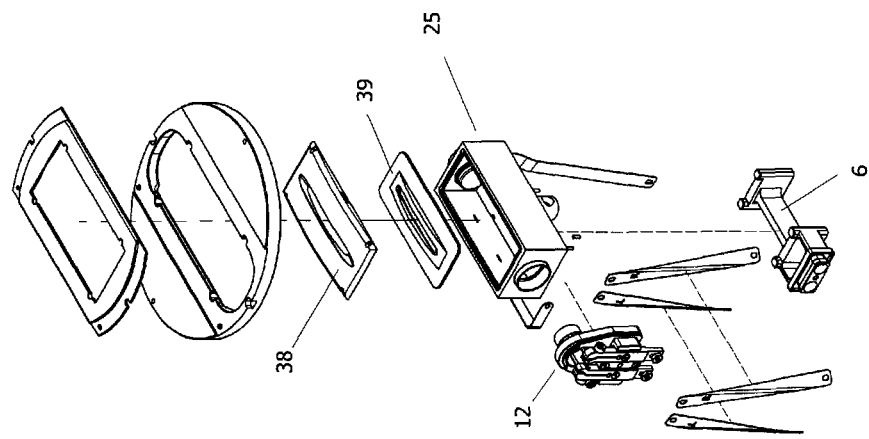
FIG. 2 is an exploded view of the high current ion source of FIG. 1.
Figure 1:
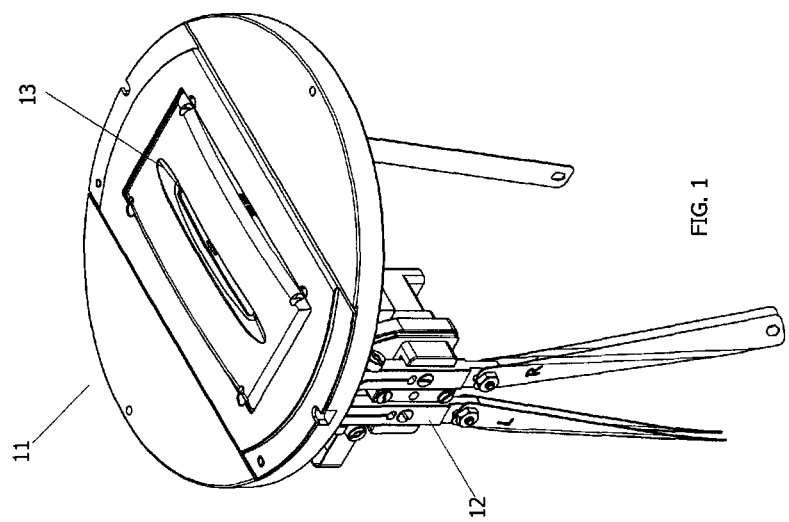
FIG. 1 is an isometric view of a high current ion source in accordance with the invention.

Referring to FIGS. 1 and 2, the ion source 11 is similar to the ion source described in Published US Patent Application 2012/0013249, the disclosure of which is incorporated by reference herein.

The high current ion source 5 includes a filament clamp assembly 12 and an arc chamber assembly 13.

Figure 3:
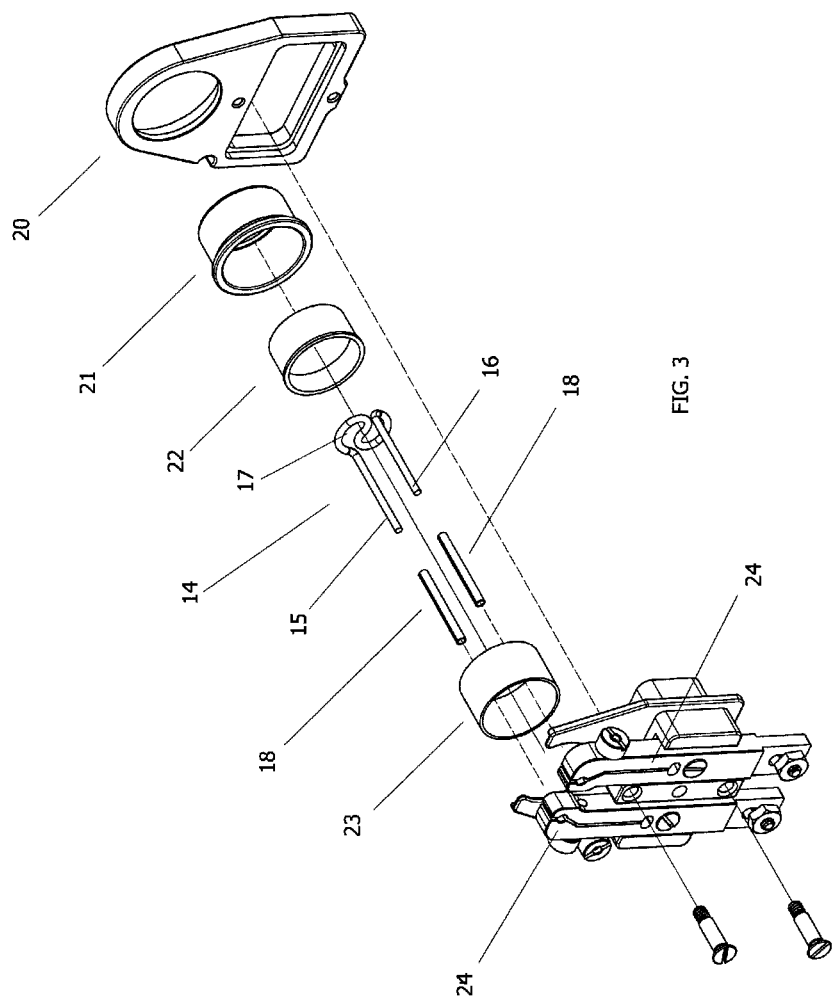
FIG. 3 is an exploded view of a high current filament/cathode assembly in the ion source of FIG. 1.

Referring to FIGS. 3, 4 and 5, the filament clamp assembly 12 includes a filament 14 with a pair of parallel connecting leads 15, 16 and a ground flat surface 17 as well as a split filament sleeve 18 about each lead 15,16. The filament sleeves 18 are cylindrical in shape with a slot 19 cut along its length. The filament sleeves 18 can be made from tantalum, tungsten, or molybdenum.

The filament clamp assembly 12 also includes a cathode sub-assembly including a graphite support plate 20, a retainer 21, a cathode 22 and a collar (spacer) 23. The cathode sub-assembly is constructed as described in Published US Patent Application 2012/0013249.

The filament clamp assembly 12 also includes a pair of clamps 24 each of which has a bifurcated end that receives the leads 15, 16 of the filament with the filament sleeves 18 therebetween. The filament sleeves 18 support the filament 14 and provide an additional thermal path to the filament clamps 24 to reduces heat transfer away from the filament 14 thereby increasing the efficiency of the ion source. The clamps 24 are constructed in a manner similar to the corresponding clamps described in Published US Patent Application 2012/0013249.

Referring to FIGS. 4 and 6, the arc chamber assembly 13 includes a housing 25 of rectangular box shape having a base 26, a pair of vertical side walls 27, a front wall 28 with an aperture 29 and a back wall 30 with an aperture 31. The base 26 and walls 27,28, 30 define an arc chamber.

Referring to FIGS. 5 and 6, an inlet port 32 is connected to the base 26 for delivering a flow of gas into the housing 25 in a symmetrically offset manner. In addition, the base 26 has a plurality of channels 33 extending from the inlet port 32 to each sidewall 27 of the housing 25.

Also, as shown in FIG. 5, a pair of inlet ports 32' are provided on the underside of the housing 25 for the delivery of a gas from a compressed gas cylinder or from a vaporized solid in known manner.

Figure 8:
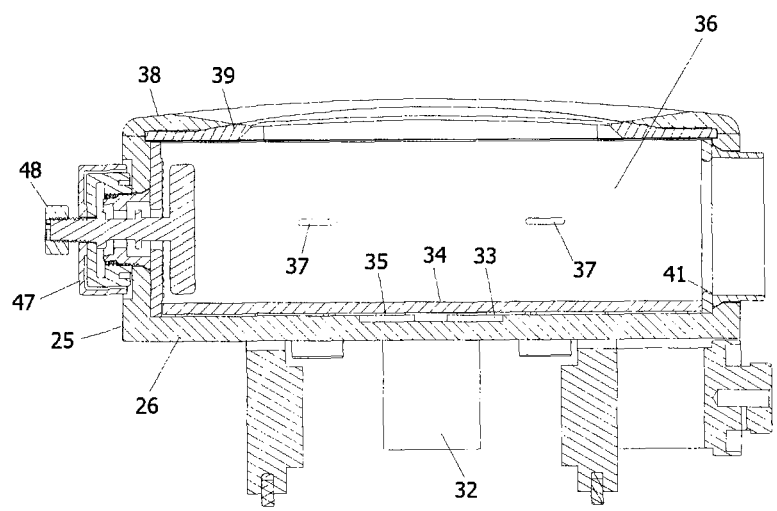
FIG. 8 is a cross sectional view taken through line 8-8 of FIG. 7.

Referring to FIG. 8, the arc chamber assembly 13 includes a bottom liner 34 of rectangular shape that is disposed in the housing 25 in spaced parallel relation to the base 26 and opposite the channels 33 for conducting a flow of gas from the inlet port 32 towards the sidewalls 27. The liner 34 is dimensioned to be received in the housing 25 in a slide fit manner with the walls 27, 28, 30 to define a plenum for the gas delivered from the inlet port 32.

As illustrated, the bottom liner 34 has a pair of notches 35 in each of two opposite side edges thereof. Each notch 35 is in communication with a respective channel 33 in the base 26 to pass gas therefrom upwardly into the arc chamber and is of semi-ovate shape.

The arc chamber assembly 13 also includes a pair of side liners 36, each of which is disposed in the housing 25 in spaced parallel relation to a respective one of the side walls 27 for conducting a flow of gas therebetween from the plenum between the base 26 and the bottom liner 34. In this respect, each side liner 36 defines a plenum with a side wall 26 that is in communication with the two notches 35 in a side edge of the bottom liner 34 to receive gas passing from the plenum between the base 26 and the bottom liner 34.

Each side liner 36 is of a thickness and positioning relative to the length of a notch 35 in the bottom liner so that the side liner 36 divides the notch 35 into one part that communicates with the space between the side liner 36 and a side wall 27 and a second part that communicates directly with the arc chamber.

Each side liner 36 has a pair of slots 37, for example, of rectangular shape, disposed at mid-height of the side liner 36 to pass gas horizontally into the arc chamber.

In operation, gas enters the arc chamber assembly 13 through port 32, the channels 33 cooperate with the bottom liner 34 to direct the gas to the notches 35. The notches 35 direct some gas into the arc chamber and also between the side liners 36 and the arc chamber. This gas enters the arc chamber through the slots 37 in the liners 36. The gas directed into the arc chamber through the four slots 37 and the four notches 35 create a uniform region for gas ionization.

Referring to FIG. 8, in known manner, the arc chamber assembly 13 also includes a removable cover 38 on the housing 25 that is provided with a liner 39 on the underside.

In addition, in known manner, the arc chamber assembly 13 has a sleeve 40 that is slidably mounted in the aperture 29 of the front wall 28 of the housing 25 to project outwardly thereof into a space within the graphite support plate 20 (not shown) and an apertured liner 41 that is in abutment with the sleeve 40 and is held in place by side liners 42 in the housing 25.

The arc chamber assembly 13 also has a repeller assembly including a repeller 43, a liner 44, a tubular shield 45, an insulator ring 46, a shield 47 and a lock nut 48.

As is known in the art, ion sources contain a cathode and an anti-cathode or repeller, the cathode or filament within the arc chamber is heated to a temperature whereby electrons are emitted from the filament; the electrons in turn plasmatize a gas introduced within the arc chamber and thereby generate ions for implanting. The anti-cathode repels electrons emitted from the cathode such that ionization of the gas is centrally focused within the arc chamber to its intended exit through the arc slit.

Figure 7:
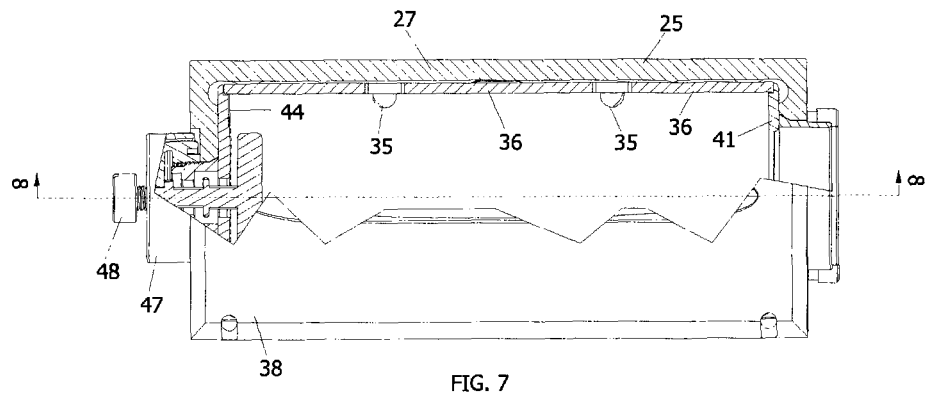
FIG. 7 is a top view of the arc chamber assembly of FIG. 4.

As indicated in FIG. 7, each side liner 36 is notched at the ends to slide fit into similar notches in the liners 41, 44 at the ends of the housing 25.

The invention provides an increase in the efficiency of the ion source by creating a uniform region with the arc chamber assembly by directing the gas flow into the arc chamber.

What is claimed is:

1. An arc chamber assembly for an ion source comprising
a housing having a base and at least one pair of side walls extending upwardly from opposite sides of said base to define an arc chamber, said base having a plurality of channels extending to each sidewall of said pair of sidewalls; an inlet port connected to said base of said housing for delivering a flow of gas into said channels of said base;
a bottom liner disposed in said housing in spaced parallel relation to said base and opposite said channels therein for conducting a flow of gas from said port towards said sidewalls, said bottom liner having at least a pair of notches in each of two opposite side edges thereof, each said notch being in communication with a respective channel of said plurality of channels in said base to pass gas therefrom upwardly into said arc chamber; and
a pair of side liners, each said side liner being disposed in said housing in spaced parallel relation to a respective one of said side walls for conducting a flow of gas therebetween from between said base and said bottom liner, each said side liner having at least a pair of slots therein to pass gas therefrom horizontally into said arc chamber.

2. An arc chamber assembly as set forth in claim 1 wherein each said side liner is removably mounted in said housing and said bottom liner is removably mounted in said housing.

3. An arc chamber assembly as set forth in claim 1 wherein each respective channel in said base extends from said inlet port to a respective notch.

4. An arc chamber assembly as set forth in claim 1 wherein each said slot in a respective side liner is in vertical alignment with a respective notch in said bottom liner.

5. An arc chamber assembly as set forth in claim 1 wherein each said slot is of rectangular shape and each said notch is of semi-ovate shape.

6. An arc chamber assembly as set forth in claim 1 wherein said housing is of rectangular box shape.

7. An arc chamber assembly as set forth in claim 1 wherein each said pair of slots in each said side liner is disposed at mid-height of said side liner.

8. An arc chamber assembly as set forth in claim 1 wherein each said side liner is positioned relative to said pair of notches in a respective side edge of said bottom liner to divide a respective notch into one part in communication with a space between said side liner and said side wall and a second part in communication directly with said arc chamber.

* * * * *